United States Patent
Hwang et al.

(10) Patent No.: US 9,012,886 B2
(45) Date of Patent: Apr. 21, 2015

(54) SEMICONDUCTOR LIGHT EMITTING DEVICE

(71) Applicant: Kabushiki Kaisha Toshiba, Tokyo (JP)

(72) Inventors: Jongil Hwang, Kanagawa-ken (JP); Shinji Saito, Kanagawa-ken (JP); Rei Hashimoto, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 13/826,787

(22) Filed: Mar. 14, 2013

(65) Prior Publication Data

US 2014/0042388 A1    Feb. 13, 2014

(30) Foreign Application Priority Data

Aug. 13, 2012 (JP) ................................. 2012-179522

(51) Int. Cl.
*H01L 31/00* (2006.01)
*H01L 33/32* (2010.01)
*H01L 33/06* (2010.01)

(52) U.S. Cl.
CPC ................ *H01L 33/32* (2013.01); *H01L 33/06* (2013.01)

(58) Field of Classification Search
USPC ........ 257/15, 85, 86, 90, 94, 96, 97, E33.008, 257/E33.01, E31.033, E23.073; 438/37
See application file for complete search history.

(56) References Cited

U.S. PATENT DOCUMENTS

| | | | | |
|---|---|---|---|---|
| 2002/0179923 A1* | 12/2002 | Morita et al. | ................. | 257/103 |
| 2010/0108985 A1* | 5/2010 | Chung et al. | ................. | 257/13 |
| 2012/0007113 A1 | 1/2012 | Hwang et al. | | |

FOREIGN PATENT DOCUMENTS

| JP | 7-211987 A | 8/1995 |
|---|---|---|
| JP | 10-84132 | 3/1998 |
| JP | 3282175 B2 | 3/2002 |
| JP | 2004-87908 A | 3/2004 |
| JP | 2004-297098 A | 10/2004 |
| JP | 2009-152552 A | 7/2009 |
| JP | 2010-3913 | 1/2010 |

(Continued)

OTHER PUBLICATIONS

Notification of Reason(s) for Refusal issued Sep. 24, 2013 in Japanese Patent Application No. 2012-179522 (with English translation).

(Continued)

*Primary Examiner* — Su C Kim
(74) *Attorney, Agent, or Firm* — Oblon, McClelland, Maier & Neustadt, L.L.P.

(57) ABSTRACT

According to one embodiment, a semiconductor light emitting device includes: a first semiconductor layer; a second semiconductor layer; and a light emitting layer provided between the first and the second semiconductor layers. The first semiconductor layer includes a nitride semiconductor, and is of an n-type. The second semiconductor layer includes a nitride semiconductor, and is of a p-type. The light emitting layer includes: a first well layer; a second well layer provided between the first well layer and the second semiconductor layer; a first barrier layer provided between the first and the second well layers; and a first Al containing layer contacting the second well layer between the first barrier layer and the second well layer and containing layer containing $Al_{x1}Ga_{1-x1}N$ ($0.1 \leq x1 \leq 0.35$).

26 Claims, 9 Drawing Sheets

(56) References Cited

FOREIGN PATENT DOCUMENTS

| | | |
|---|---|---|
| JP | 2011-35156 | 2/2011 |
| JP | 2011-176240 A | 9/2011 |
| JP | 2012-19068 A | 1/2012 |
| WO | WO 2004/042832 A1 | 5/2004 |

OTHER PUBLICATIONS

Office Action issued May 2, 2013 in Japanese Patent Application No. 2012-179522 with English language translation.

Office Action issued Jul. 29, 2014 in Korean Patent Application No. 10-2013-90604 (with English language translation).

\* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2012-179522, filed on Aug. 13, 2012; the entire contents of which are incorporated herein by reference.

FIELD

Embodiments described herein relate generally to a semiconductor light emitting device.

BACKGROUND

In semiconductor light emitting devices such as an LD (Laser Diode) and an LED (Light Emitting Diode), it is desired to improve light emitting efficiency.

In the semiconductor light emitting device, a nitride semiconductor containing In is used for an active layer, for example. When the In composition ratio of the active layer is increased in order to obtain a desired light emission wavelength, such tendencies are observed that crystal quality deteriorates and light emitting efficiency is reduced.

DETAILED DESCRIPTION

Figure 1:
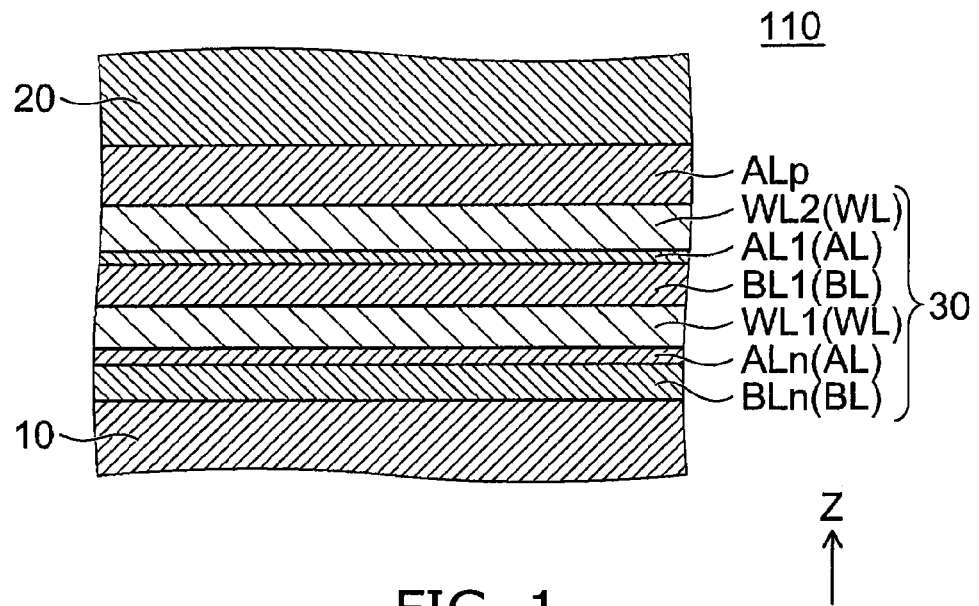
FIG. 1 is a schematic cross-sectional view illustrating a configuration of a semiconductor light emitting device according to a first embodiment.

In general, according to one embodiment, a semiconductor light emitting device includes: a first semiconductor layer including a nitride semiconductor, the first semiconductor layer being of an n-type; a second semiconductor layer including a nitride semiconductor, the second semiconductor layer being of a p-type; and a light emitting layer provided between the first semiconductor layer and the second semiconductor layer. The light emitting layer includes: a first well layer including a nitride semiconductor; a second well layer provided between the first well layer and the second semiconductor layer and including a nitride semiconductor; a first barrier layer provided between the first well layer and the second well layer and including a nitride semiconductor, a band gap energy of the first barrier layer being greater than a band gap energy of the first well layer and a band gap energy of the second well layer; and a first Al containing layer contacting the second well layer between the first barrier layer and the second well layer and containing layer containing $Al_{x1}Ga_{1-x1}N$ ($0.1 \leq x1 \leq 0.35$).

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or shown in a drawing hereinabove are marked with the identical reference numerals, and a detailed description is omitted as appropriate.

First Embodiment

FIG. 1 is a schematic cross-sectional view illustrating the configuration of a semiconductor light emitting device according to a first embodiment. As shown in FIG. 1, a semiconductor light emitting device 110 according to the embodiment includes a first semiconductor layer 10, a second semiconductor layer 20, and a light emitting layer 30.

The first semiconductor layer 10 includes a nitride semiconductor, and the first semiconductor layer 10 is of an n-type. The second semiconductor layer 20 includes a nitride semiconductor, and the second semiconductor layer 20 is of a p-type. The light emitting layer 30 is provided between the first semiconductor layer 10 and the second semiconductor layer 20.

Here, suppose that a direction from the first semiconductor layer 10 to the second semiconductor layer 20 is a Z-axis direction. In the semiconductor light emitting device 110, the light emitting layer 30 is provided on the first semiconductor layer 10, and the second semiconductor layer 20 is provided on the light emitting layer 30. The first semiconductor layer 10, the light emitting layer 30, and the second semiconductor layer 20 are stacked in this order in the Z-axis direction.

In the specification, a state in which "a component is provided on another component" includes a state in which a component is directly provided on another component as well as a state in which a component is provided on another component with a different element inserted between the components. A state in which "a component is stacked on another component" includes a state in which a component is stacked on another component with each other as well as a state in which a component is stacked on another component with a different element inserted between the components.

The second semiconductor layer 20 opposes the first semiconductor layer 10 through the light emitting layer 30. In the specification, a state in which "a component opposes another component" includes a state in which a component directly faces another component as well as a state in which a component indirectly faces another component with a different element inserted between the components.

In the following, phrases "the lower side" and "the upper side" are used for simplifying the explanation. "The lower side" corresponds to the first semiconductor layer 10 side, and "the upper side" corresponds to the second semiconductor layer 20 side.

A GaN layer containing an n-type impurity is used for the first semiconductor layer 10, for example. At least one of Si, Ge, Te, and Sn can be used for the n-type impurity. The first semiconductor layer 10 includes an n-side contact layer, for example.

A GaN layer containing a p-type impurity is used for the second semiconductor layer 20, for example. At least one of Mg, Zn, and C can be used for the p-type impurity. The second semiconductor layer 20 includes a p-side contact layer, for example.

The light emitting layer 30 includes a plurality of well layers WL (including a first well layer WL1 and a second well layer WL2, for example), a barrier layer BL, and an Al containing layer AL. The well layer WL includes a nitride semiconductor. The barrier layer BL is provided between the well layers WL. The band gap energy of the barrier layer BL is greater than the band gap energy of the well layer WL. The barrier layer BL includes a nitride semiconductor.

The Al containing layer AL is provided between a single barrier layer BL and a p-side well layer WL provided between the single barrier layer BL and the second semiconductor layer 10, and contacts the p-side well layer WL. The Al containing layer AL contacts the single barrier layer BL, for example. The Al containing layer AL contains $Al_{x0}Ga_{1-x0}N$ ($0.1 \leq x0 \leq 0.35$). $x0$ is the Al composition ratio of the Al containing layer AL. The thickness of the Al containing layer AL is 0.5 nanometer (nm) or more and 2.5 nm or less, for example.

Namely, the light emitting layer 30 includes the first well layer WL1, the second well layer WL2, a first barrier layer BL1, and a first Al containing layer AL1. The first well layer WL1 and the second well layer WL include a nitride semiconductor. The second well layer WL2 is provided between the first well layer WL1 and the second semiconductor layer 20. The first barrier layer BL1 is provided between the first well layer WL1 and the second well layer WL2. The band gap energy of the first barrier layer BL1 is greater than the band gap energy of the first well layer WL1 and the band gap energy of the second well layer WL2. The first barrier layer BL1 includes a nitride semiconductor.

The first Al containing layer AL1 contacts the second well layer WL2 between the first barrier layer BL1 and the second well layer WL2. The first Al containing layer AL1 contains $Al_{x1}Ga_{1-x1}N$ ($0.1 \leq x1 \leq 0.35$). The first Al containing layer AL1 contacts the first barrier layer BL1, for example. The thickness of the first Al containing layer is 0.5 nm or more and 2.5 nm or less, for example.

In this example, the light emitting layer 30 further includes an n-side barrier layer BLn and an n-side Al containing layer ALn. The n-side barrier layer BLn is provided between the first well layer WL1 and the first semiconductor layer 10. The band gap energy of the n-side barrier layer BLn is greater than the band gap energy of the first well layer WL1 and the band gap energy of the second well layer WL2. The n-side barrier layer BLn includes a nitride semiconductor.

As described later, band gap energy is sometimes changed in a single well layer WL. Namely, a first portion of a relatively small band gap energy and other portions of a larger band gap energy than in the first portion (portions of relatively large band gap energy) are sometimes provided in a single well layer WL. When these portions are provided, a state in which "the band gap energy of a portion is greater than the band gap energy of the well layer WL" is referred to as a state in which "the band gap energy of a portion is greater than the band gap energy of a portion of a relatively large band gap energy in the well layer WL".

The n-side Al containing layer ALn contacts the first well layer WL1 between the n-side barrier layer BLn and the first well layer WL1. The n-side Al containing layer ALn contains $Al_{xn}Ga_{1-xn}N$ ($0.1 \leq xn \leq 0.35$). The n-side Al containing layer ALn contacts the n-side barrier layer BLn, for example. The thickness of the n-side Al containing layer is 0.5 nm or more and 2.5 nm or less, for example.

In this example, the semiconductor light emitting device 110 further includes a p-side Al containing layer ALp. The p-side Al containing layer ALp is provided between the light emitting layer 30 and the second semiconductor layer 20. The band gap energy of the p-side Al containing layer ALp is greater than the band gap energy of the first barrier layer BL1, and the p-side Al containing layer ALp includes a nitride semiconductor containing Al. Namely, the band gap energy of the p-side Al containing layer ALp is greater than the band gap energy of the well layer WL.

In the semiconductor light emitting device 110, a current is supplied to the light emitting layer 30 through the first semiconductor layer 10 and the second semiconductor layer 20, and light is emitted from the light emitting layer 30. The peak wavelength of the light emitted from the light emitting layer 30 is 400 nm or more and 670 nm or less, for example.

The band gap energy of the well layer WL and the thickness of the well layer WL are set in such a way that the peak wavelength of the light emitted from the light emitting layer 30 is 400 nm or more and 670 nm or less, for example.

For example, the well layer WL includes a portion containing $In_{p0}Ga_{1-p0}N$ ($0.1 < p0 \leq 0.4$). The thickness of the well layer WL is 1.5 nm or more and 5 nm or less, for example. An exemplary configuration of the well layer WL will be described later.

The semiconductor light emitting device 110 is an LED, for example. The semiconductor light emitting device 110 may be an LD. In this case, at least a part of the first semiconductor layer 10 and at least a part of the second semiconductor layer 20 have a functionality to guide the waves of the light emitted from the light emitting layer 30.

In the embodiment, the second semiconductor layer 20 is disposed on the [0001] direction side of the first semiconductor layer 10, for example. However, the surface of the first semiconductor layer 10 opposing the second semiconductor layer 20 (the surface is referred to as a top surface for convenience) may not be a strict (0001) plane. The top surface may be a plane tilted at a certain offset angle from a strict (0001) plane. This offset an angle is an angle of zero degree or more and less than an angle of 90 degrees, for example. In the state in which the second semiconductor layer 20 is provided on the [0001] direction side of the first semiconductor layer 10 also includes the case where the surface of the first semiconductor layer 10 in the Z-axis direction is tilted from the (0001) plane as described above.

The major surface of the first semiconductor layer 10 is a c-plane, for example. For example, a buffer layer, not shown, is formed on a substrate (not shown), and the first semiconductor layer 10, the light emitting layer 30, and the second semiconductor layer 20 are sequentially formed on the buffer layer. A c-plane sapphire substrate is used for the substrate, for example. Any one of (110), (111), and (100) silicon (Si) substrates may be used for the substrate, for example. After forming these layers, the substrate and the buffer layer may be removed.

In the embodiment, the Al containing layer AL is provided to improve the flatness of the well layer WL, for example, and the crystal quality of the well layer WL is also improved. Thereby, the recombination efficiencies of electrons and holes are improved in the light emitting layer 30.

According to the embodiment, it is possible to provide a highly efficient semiconductor light emitting device of a high crystal quality. These effects exerted by providing the Al containing layer AL were found through an experiment conducted by the inventors. This experiment will be described later.

In the following, some examples of the semiconductor light emitting device according to the embodiment will be described.

Figure 2:
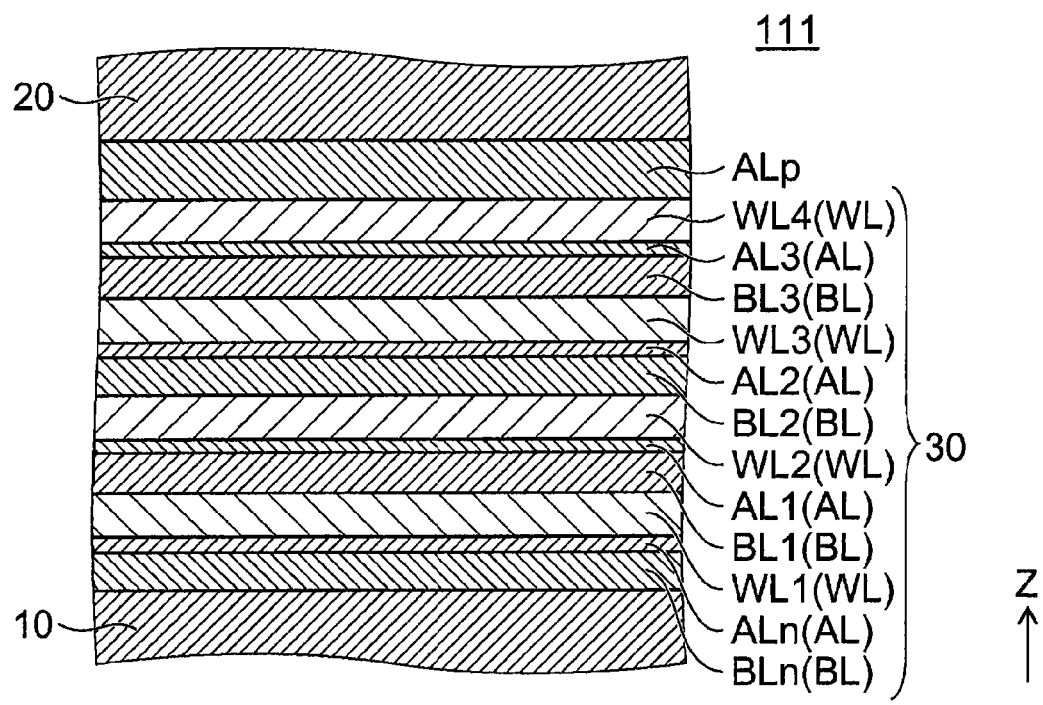
FIG. 2 is a schematic cross-sectional view illustrating a configuration of another semiconductor light emitting device according to the first embodiment.

FIG. 2 is a schematic cross-sectional view illustrating the configuration of another semiconductor light emitting device according to the first embodiment.

As shown in FIG. 2, in a semiconductor light emitting device 111 according to the embodiment, a light emitting layer 30 further includes a third well layer WL3, a fourth well layer WL4, a second barrier layer BL2, a third barrier layer BL3, a second Al containing layer AL2, and a third Al containing layer AL3. The configurations other than the configuration are the same in the semiconductor light emitting device 110, and the description is omitted.

The third well layer WL3 is provided between the second well layer WL2 and a second semiconductor layer 20, and includes a nitride semiconductor. The second barrier layer BL2 is provided between the second well layer WL2 and the third well layer WL3. The band gap energy of the second barrier layer BL2 is greater than the band gap energy of the second well layer WL2 and the band gap energy of the third well layer WL3, and the second barrier layer BL2 includes a nitride semiconductor. The second Al containing layer AL2 contacts the third well layer WL3 between the second barrier layer BL2 and the third well layer WL3. The second Al containing layer AL2 contains $Al_{x2}Ga_{1-x2}N$ ($0.1 \le x2 \le 0.35$). The second Al containing layer AL2 contacts the second barrier layer BL2, for example. The thickness of the second Al containing layer AL2 is 0.5 nm or more and 2.5 nm or less.

As described above, N (N is an integer of two or more) of the well layers WL are provided, for example.

An ith well layer WLi (i is an integer of two or more) is provided between an (i−1)th well layer WL(i−1) and the second semiconductor layer 20, and includes a nitride semiconductor. An (i−1)th barrier layer BL(i−1) is provided between the (i−1)th well layer WL(i−1) and the ith well layer WLi. The band gap energy of the (i−1)th barrier layer BL(i−1) is greater than the band gap energy of the (i−1)th well layer WL(i−1) and the band gap energy of the ith well layer WLi, and the (i−1)th barrier layer BL(i−1) includes a nitride semiconductor. An (i−1)th Al containing layer AL(i−1) contacts the ith well layer WLi between the (i−1)th barrier layer BL(i−1) and the ith well layer WLi. The (i−1)th Al containing layer AL(i−1) contains $Al_{x(i-1)}Ga_{1-x(i-1)}N$ ($0.1 \le x(i-1) \le 0.35$). The (i−1)th Al containing layer AL(i−1) contacts the (i−1)th barrier layer BL(i−1), for example. The thickness of the (i−1)th Al containing layer AL(i−1) is 0.5 nm or more and 2.5 nm or less.

In this example, four well layers WL are provided. However, the number of the well layers WL is optional in the embodiment.

In this example, the Al containing layer AL is provided on the lower side of the individual well layers WL (on the first semiconductor layer 10 side). However, the Al containing layer AL may be provided on the lower side of any one of the well layers WL.

For example, the Al containing layer AL may be provided on the lower side of the well layer WL close (the closest, for example) to the first semiconductor layer 10 among the well layers WL. In this case, the crystal quality of the well layer WL in the initial stage of crystal growth (the first well layer WL, for example) is improved when crystals are grown from the first semiconductor layer 10 side. Therefore, the crystal quality of another layer crystal-grown on the well layer WL is improved, and the entire light emitting efficiency is improved.

On the other hand, for example, the Al containing layer AL may be provided on the lower side of the well layer WL close (the closest, for example) to the second semiconductor layer 20 among the well layers WL. It was revealed that light is mainly emitted in the well layer WL close to the p-type second semiconductor layer 20. Therefore, the Al containing layer AL is provided below the well layer WL close (the closest) to the second semiconductor layer 20 to improve the crystal quality of the well layer WL. Accordingly, the light emitting efficiency is improved.

Figure 3:
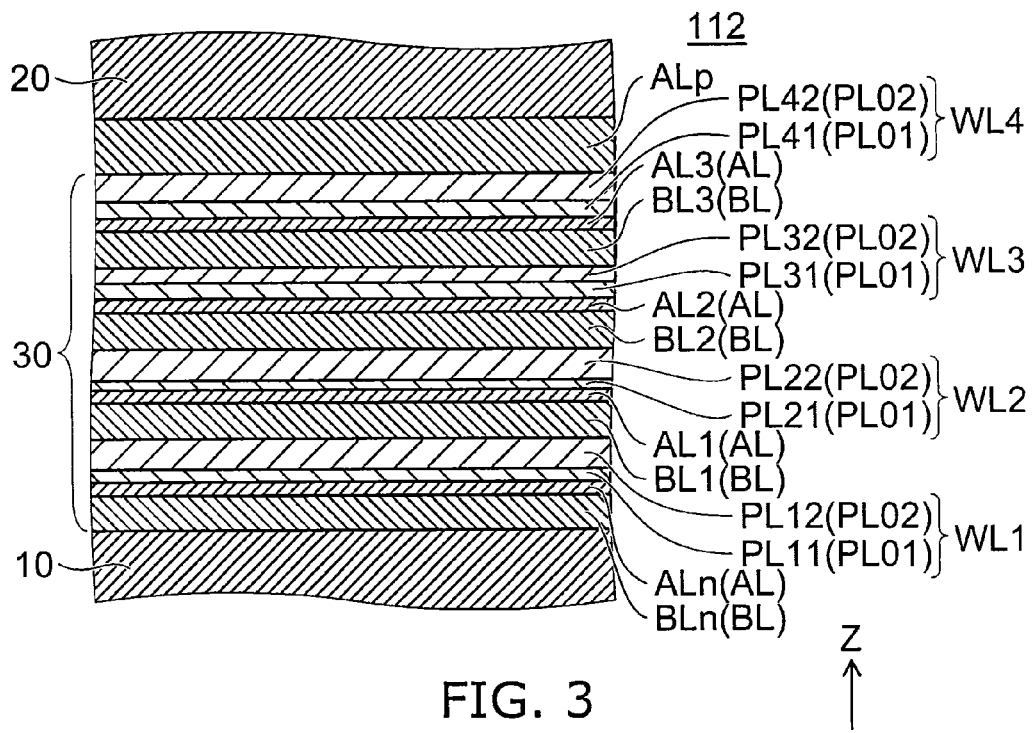
FIG. 3 is a schematic cross-sectional view illustrating a configuration of still another semiconductor light emitting device according to the first embodiment.

FIG. 3 is a schematic cross-sectional view illustrating the configuration of still another semiconductor light emitting device according to the first embodiment.

As shown in FIG. 3, in a semiconductor light emitting device 112 according to the embodiment, the In concentration (the In composition ratio) is changed in a single well layer WL. The configurations other than the configuration are the same in the semiconductor light emitting device 111, and the description is omitted.

For example, the well layer WL includes a first portion PL01 containing $In_{p01}Ga_{1-p01}N$ ($0.1 < p01 \le 0.4$). The first portion PL01 is a portion of a relatively high In concentration. The well layer WL further includes a second portion PL02. The second portion PL02 is provided between the first portion PL01 and a second semiconductor layer 20, and contains $In_{p02}Ga_{1-p02}N$ ($0 < p02 < p01$).

For example, a second well layer WL1 includes a first portion PL21 containing $In_{p21}Ga_{1-p21}N$ ($0.1 < p21 \le 0.4$). A second well layer WL2 further includes a second portion PL22. The second portion PL22 is provided between the first portion PL21 and the second semiconductor layer 20, and contains $In_{p22}Ga_{1-p22}N$ ($0 < p22 < p21$).

A portion of a relatively high In concentration and a portion of a relatively low In concentration may be provided on at least a part of the well layers WL.

Figure 4:
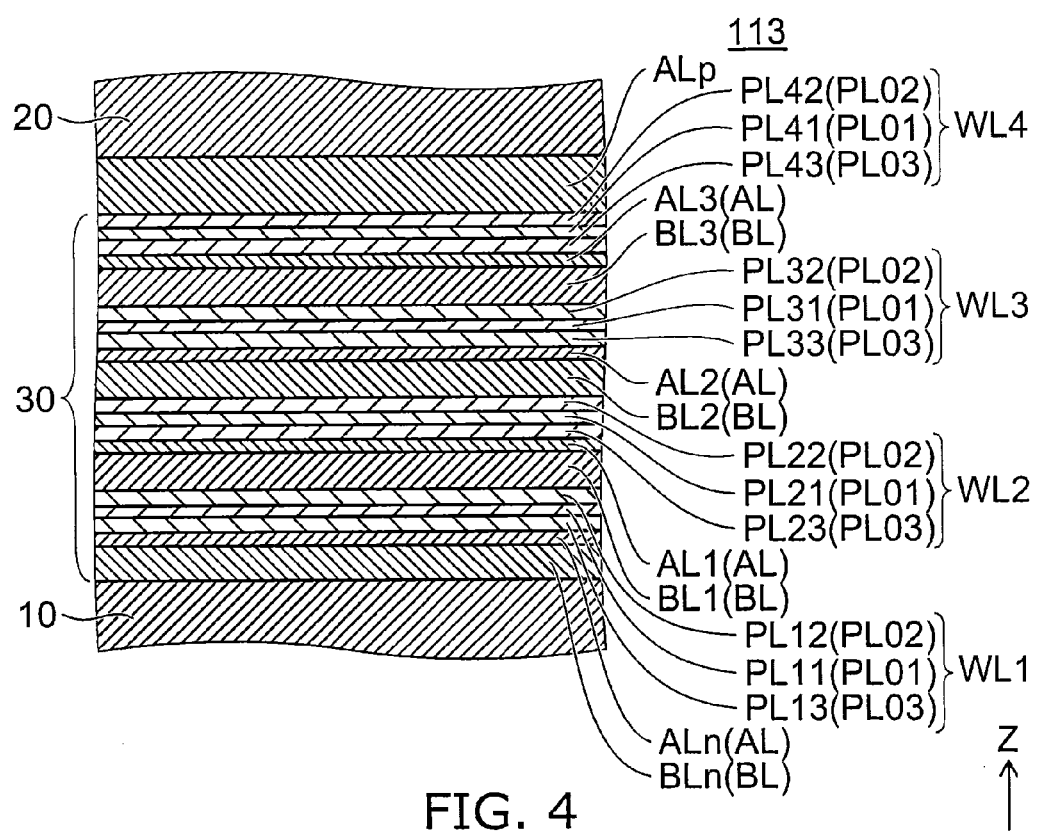
FIG. 4 is a schematic cross-sectional view illustrating a configuration of yet another semiconductor light emitting device according to the first embodiment.

FIG. 4 is a schematic cross-sectional view illustrating the configuration of yet another semiconductor light emitting device according to the first embodiment.

As shown in FIG. 4, in a semiconductor light emitting device 113 according to the embodiment, a portion of a relatively high In concentration (a high In composition ratio) is disposed between two portions of a relatively low In concentration in a single well layer WL. The configurations other than the configuration are the same in the semiconductor light emitting device 112, and the description is omitted.

For example, the well layer WL includes a first portion PL01, a second portion PL02, and a third portion PL03. The first portion PL01 contains $In_{p01}Ga_{1-p01}N$ ($0.1 < p01 \le 0.4$). The second portion PL02 is provided between the first portion PL01 and a second semiconductor layer 20. The second portion PL02 contains $In_{p02}Ga_{1-p02}N$ (0<p02<p01). The third portion PL03 is provided between the first portion PL01 and a first semiconductor layer 10. The third portion PL03 contains $In_{p03}Ga_{1-p03}N$ (0<p03<p01).

For example, a second well layer WL2 includes a first portion PL21 containing $In_{p21}Ga_{1-p21}N$ (0.1<p21≤0.4), a second portion PL22 provided between the first portion PL21 and the second semiconductor layer 20 and containing $In_{p22}Ga_{1-p22}N$ (0<p22<p21), and a third portion PL23 provided between the first portion PL21 and a first Al containing layer AL1 (the first portion PL21 and the first semiconductor layer 10) and containing $In_{p23}Ga_{1-p23}N$ (0<p23<p21).

Similarly, a third well layer WL3 includes a first portion PL31 of the third well layer WL3 containing $In_{p31}Ga_{1-p31}N$ (0.1<p31≤0.4), a second portion PL32 of the third well layer WL3 provided between the first portion PL31 of the third well layer WL3 and the second semiconductor layer 20 and containing $In_{p32}Ga_{1-p32}N$ (0<p32<p31), and a third portion PL33 of the third well layer WL3 provided between the first portion PL31 of the third well layer WL3 and the first semiconductor layer 10 and containing $In_{p33}Ga_{1-p33}N$ (0<p33<p31).

Similarly, a fourth well layer WL4 includes a first portion PL41 of the fourth well layer WL4 containing $In_{p41}Ga_{1-p41}N$ (0.1<p 41≤0.4), a second portion PL42 of the fourth well layer WL4 provided between the first portion PL41 of the fourth well layer WL4 and the second semiconductor layer 20 and containing $In_{p42}Ga_{1-p42}N$ (0<p42<p41), and a third portion PL43 of the fourth well layer WL4 provided between the first portion PL41 of the fourth well layer WL4 and the first semiconductor layer 10 and containing $In_{p43}Ga_{1-p43}N$ (0<p43<p41).

The In composition ratio of the first portion PL01 of the well layer WL1 is 0.1 or more and 0.4 or less, for example, and 0.3, for example. The In composition ratios of the second portion PL02 and the third portion PL03 are 0.02 or more and less than 0.2, for example, and 0.1, for example.

As described above, in the well layer WL, the first portion PL01 of a high In composition ratio, the second portion PL02 of a low In composition ratio, and the third portion PL03 of a low In composition ratio are provided to form an appropriate strain in the well layer WL, so that a piezoelectric field can be caused effectively. Thereby, it is possible to bring the location of the spatial distribution of electrons close to the location of the spatial distribution of holes. Accordingly, it is possible to improve light emitting efficiency.

As described above, the well layer WL can include a plurality of sub layers. In composition ratios are different in the sub layers, and the band gap energy is varied correspondingly. The number of the sub layers is optional.

A change in (the distribution of) the In composition ratio of the well layer WL may be continuous, or may be in stages (discontinuous). The distribution of the In composition ratio may be different from each other among the well layers WL.

The distribution of the band gap energy of the well layer WL is changed according to the distribution of the In composition ratio in the well layer WL. A change in (the distribution of) the band gap energy of the well layer WL may be continuous, or may be in stages (discontinuous).

Figure 5:
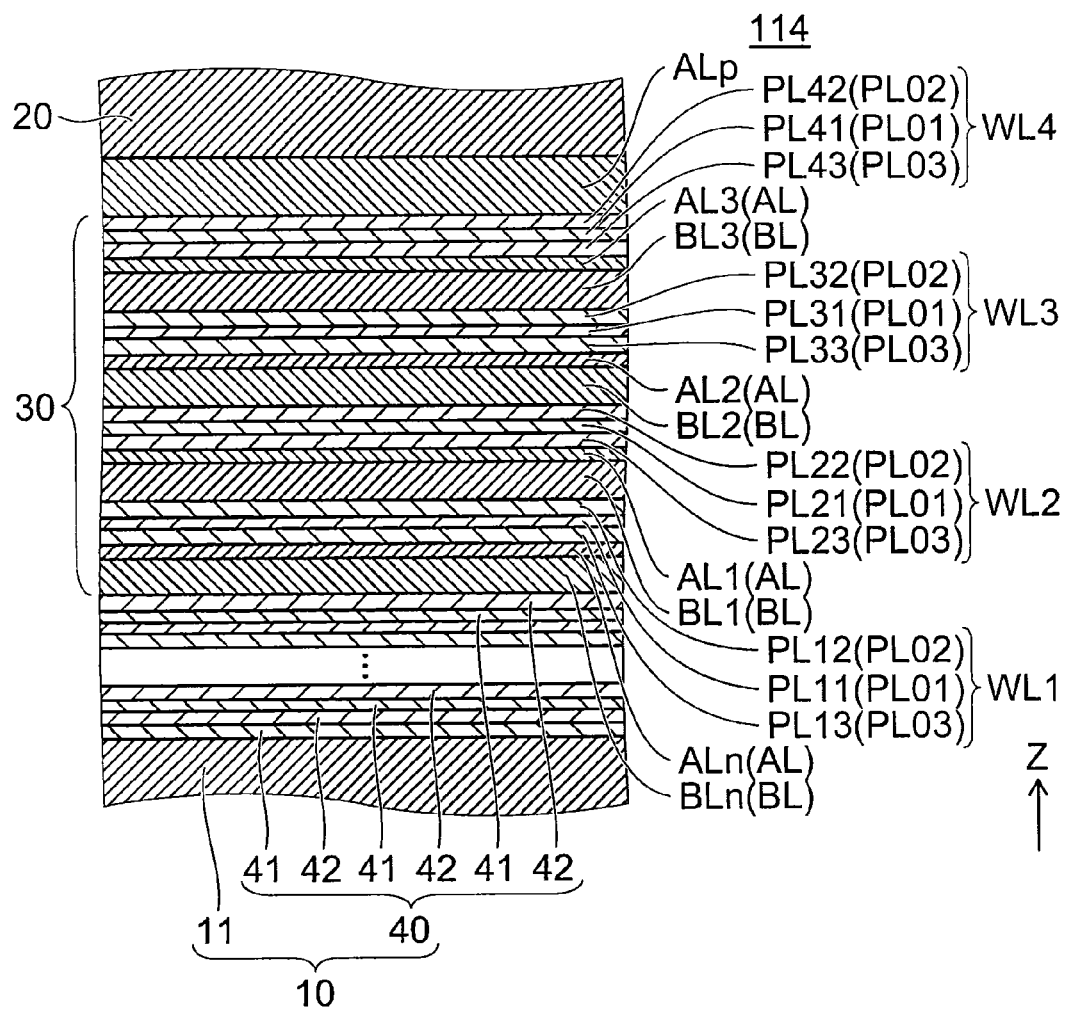
FIG. 5 is a schematic cross-sectional view illustrating a configuration of still yet another semiconductor light emitting device according to the first embodiment.

FIG. 5 is a schematic cross-sectional view illustrating the configuration of still yet another semiconductor light emitting device according to the first embodiment.

As shown in FIG. 5, in a semiconductor light emitting device 114 according to the embodiment, a first semiconductor layer 10 includes an n-type nitride semiconductor layer 11 and a stacked body 40 provided between the nitride semiconductor layer 11 and a light emitting layer 30.

GaN containing an n-type impurity is used for the n-type nitride semiconductor layer 11, for example.

The stacked body 40 includes a plurality of first films 41 and a plurality of second films 42 alternately stacked on each other. The stacking direction of the first films 41 and the second films 42 is the Z-axis direction. The band gap energy of the second film 42 is greater than the band gap energy of the first film 41. InGaN is used for the first film 41, for example, and GaN is used for the second film, for example. The thickness of the first film 41 is 0.5 nm or more and 2 nm or less, for example. The thickness of the second film 42 is 0.5 nm or more and 2 nm or less, for example. The stacked body 40 is a superlattice, for example. The stacked body 40 improves the crystal quality of the light emitting layer 30, for example.

The stacked body 40 contains an n-type impurity, for example. The stacked body 40 may not contain any n-type impurities. In the embodiment, crystal quality is improved, and the light emitting efficiency is improved. In the following, an experiment from which such findings were obtained will be described.

In the experiment below, the semiconductor light emitting device 114 was prepared.

In the experiment, a buffer layer was formed on a c-plane sapphire substrate. The buffer layer includes a low-temperature GaN layer formed on the substrate and a GaN layer formed on the low-temperature GaN layer. The stacked body 40 was formed on the buffer layer. An n-type GaN layer was formed for the n-type nitride semiconductor layer 11 on the stacked body 40. The stacked body 40 was formed on the n-type GaN layer, the light emitting layer 30 was formed on the stacked body 40, the p-side Al containing layer ALp was formed on the light emitting layer 30, and the second semiconductor layer 20 was formed on the p-side Al containing layer ALp. Metal-organic chemical vapor deposition (MOCVD) was used for a method for growing these semiconductor layers. Metal-organic vapor phase epitaxy may be used, for example.

In the experiment, the number of the well layers WL is four. The Al containing layer AL was formed below the individual well layers WL. Namely, the Al containing layer AL is formed after forming the barrier layer BL, and the well layer WL is formed on the Al containing layer Al. In forming the well layer WL, the first to third portions are formed. The process for forming the stacked film is repeated for four times. The Al composition ratio of the Al containing layer AL is 0.3. The thickness of the Al containing layer AL is about 1.5 nm.

The barrier layer BL is GaN, and the thickness is about 10 nm. The In composition ratio of the first portion of the well layer WL is 0.3, and the thickness of the first portion is 2 nm. The In composition ratio of the second portion is 0.15, and the thickness of the second portion is 1 nm. The In composition ratio of the third portion is 0.15, and the thickness of the third portion is 1 nm.

The p-side Al containing layer ALp is formed, and the second semiconductor layer 20 is formed on the p-side Al containing layer ALp. Thereby, the semiconductor light emitting device 114 is prepared.

In the experiment, a semiconductor light emitting device 191 according to a reference sample was also prepared (a structure is not shown). In the semiconductor light emitting device 191 according to the reference sample, the Al containing layer is not provided in the configuration of the semiconductor light emitting device 114, and the other conditions are the same in the semiconductor light emitting device 114. Namely, in preparing the semiconductor light emitting device, the well layers WL were directly formed on the individual barrier layers BL without forming the Al containing layer AL.

On the semiconductor light emitting devices 114 and 191, cross sections were observed using an electron microscope (TEM: Transmission Electron Microscope), and time-resolved photoluminescence characteristics were evaluated. The surface states of these samples were evaluated using an atomic force microscope (AFM).

Figure 6A:
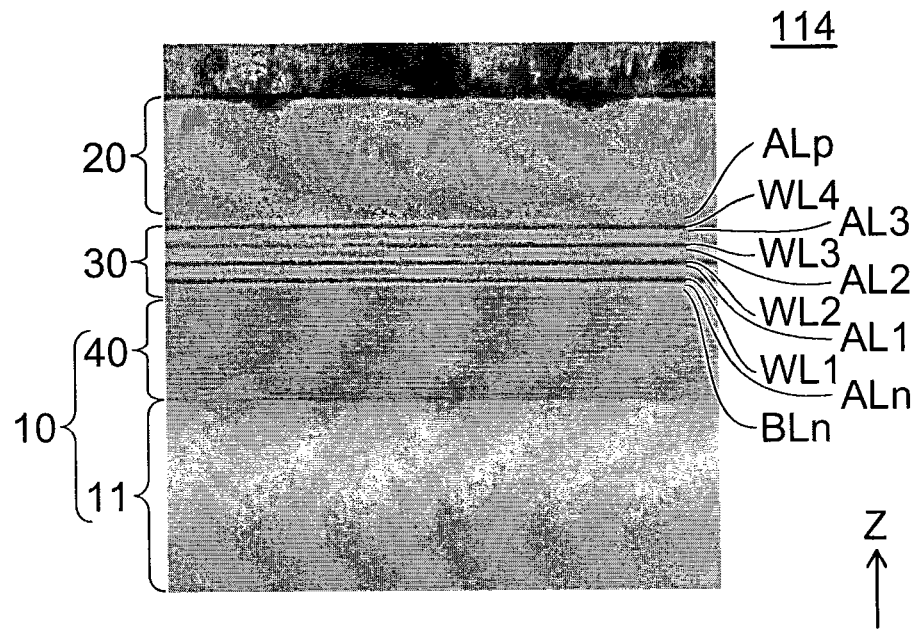
FIG. 6A and FIG. 6B are transmission electron microscope images of the semiconductor light emitting devices.
Figure 6B:
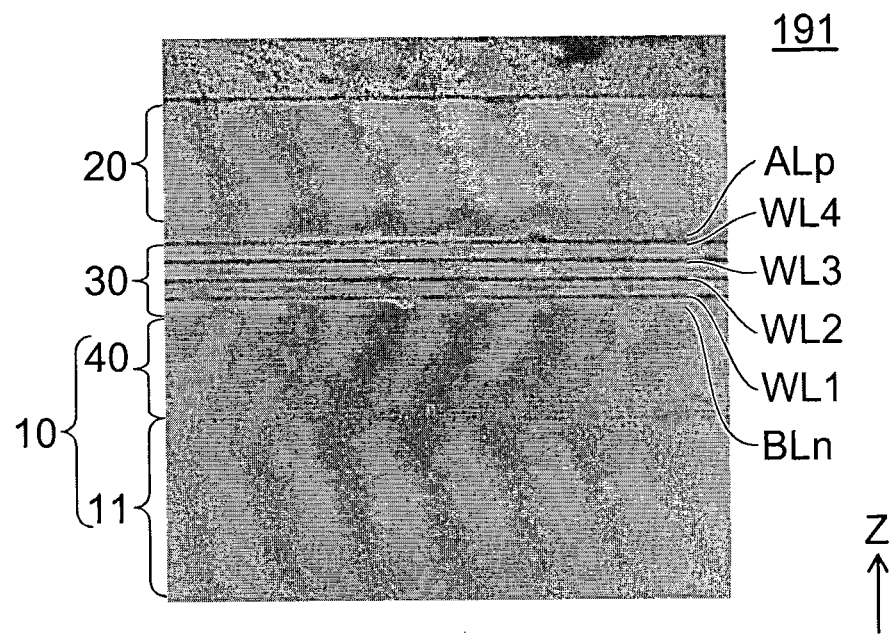

FIG. 6A and FIG. 6B are the transmission electron microscope images of the semiconductor light emitting devices.

FIG. 6A corresponds to the semiconductor light emitting device 114, and FIG. 6B and corresponds to the semiconductor light emitting device 191 according to the reference sample. The locations of the barrier layers BL are not shown because of complicatedness.

As revealed from FIG. 6B, in the semiconductor light emitting device 191 in which the Al containing layer AL is not provided below the well layer WL, dark, belt-shaped images corresponding to the well layers WL (the first well layer WL1 to the fourth well layer WL4) are unclear. This is considered that the boundaries between the well layer WL and the layers (namely, the barrier layers BL) above and below the well layer WL are unclear and desired layers are not formed. It is also considered that the crystal quality of these layers is poor.

On the contrary, as revealed from FIG. 6A, in the semiconductor light emitting device 114 in which the Al containing layer AL is provided below the well layer WL, dark, belt-shaped images corresponding to the well layers WL (the first well layer WL1 to the fourth well layer WL4) are very clear. Namely, it is considered that the boundaries between the well layer WL and the layers (the Al containing layer AL and the barrier layer BL) above and below the well layer WL are clear and desired layers are formed. It is also considered that the crystal quality of these layers is excellent.

Figure 7A:
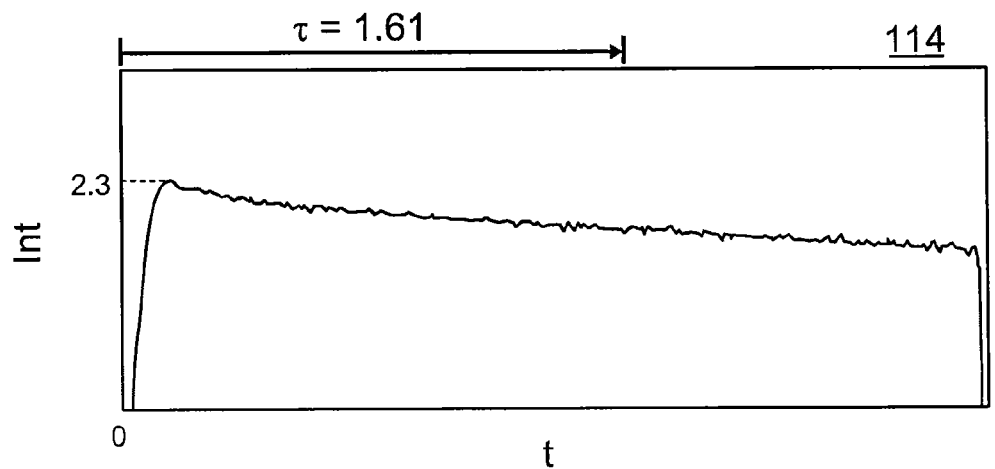
FIG. 7A and FIG. 7B are graphs showing time-resolved photoluminescence characteristics of the semiconductor light emitting devices.
Figure 7B:
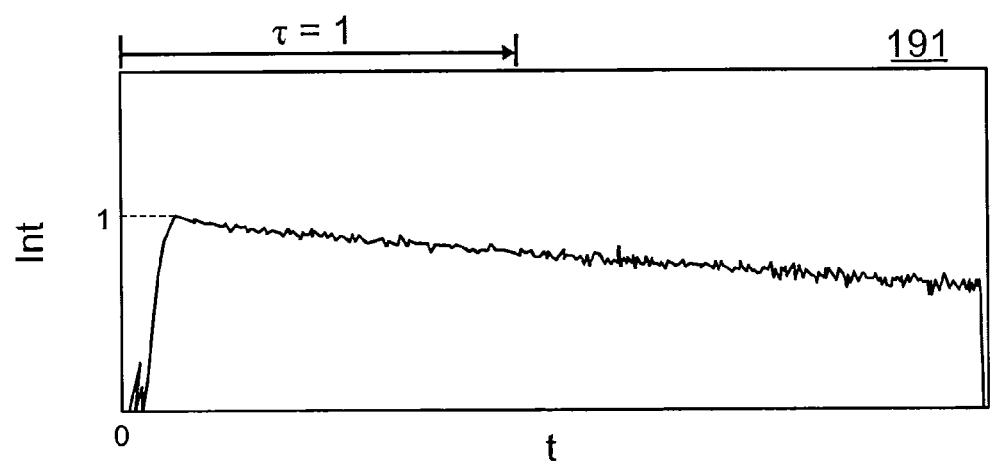

FIG. 7A and FIG. 7B are graphs showing the time-resolved photoluminescence characteristics of the semiconductor light emitting devices.

FIG. 7A corresponds to the semiconductor light emitting device 114, and FIG. 7B corresponds to the semiconductor light emitting device 191 according to the reference sample. In FIG. 7A and FIG. 7B, the horizontal axis expresses time t, and the vertical axis expresses intensity Int of the obtained photoluminescence. The intensity Int is normalized where the maximum intensity of the semiconductor light emitting device 119 is one.

As revealed from FIG. 7B, in the semiconductor light emitting device 191, the photoluminescence intensity Int is attenuated faster. The attenuation time constant $\tau$ of photoluminescence of the semiconductor light emitting device 191 is short. Photoluminescence is attenuated because electrons in the well layer WL are captured by defects or the like in the layer and photoluminescence is gone. The maximum value of the photoluminescence intensity Int is small.

On the contrary, as revealed from FIG. 7A, in the semiconductor light emitting device 114, the photoluminescence intensity Int is attenuated gently. The attenuation time constant $\tau$ of photoluminescence of the semiconductor light emitting device 114 is long. When the attenuation time constant $\tau$ is normalized where the attenuation time constant $\tau$ of photoluminescence of the semiconductor light emitting device 191 is one, the attenuation time constant $\tau$ of photoluminescence of the semiconductor light emitting device 114 is 1.61. When the intensity Int is normalized where the maximum value of the photoluminescence intensity Int of the semiconductor light emitting device 191 is one, the maximum value of the photoluminescence intensity Int of the semiconductor light emitting device 114 is about 2.3, and high.

As described above, the Al containing layer AL is provided below the well layer WL, so that the maximum value of the photoluminescence intensity Int is increased and the time constant of photoluminescence is prolonged. This means that the crystal defects of the well layer WL, which cause electrons in the well layer WL to be gone, are few, for example. Namely, it was revealed that the Al containing layer AL is provided below the well layer WL to suppress the crystal defects of the well layer WL for improving crystal quality, for example. Accordingly, it is possible to improve light emitting efficiency because crystal quality is improved.

Figure 8A:
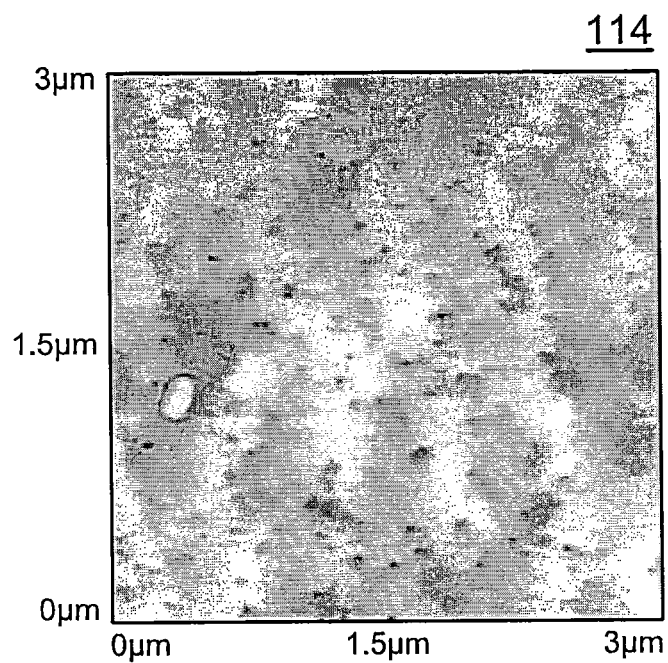
FIG. 8A and FIG. 8B are atomic force photomicrograph images illustrating surface states of the semiconductor light emitting devices.
Figure 8B:
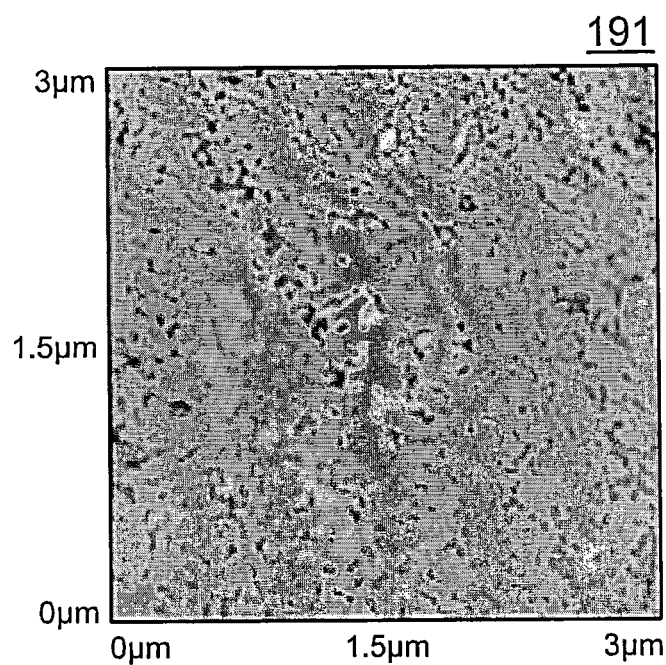

FIG. 8A and FIG. 8B are atomic force photomicrograph images illustrating the surface states of the semiconductor light emitting devices.

FIG. 8A corresponds to the semiconductor light emitting device 114, and FIG. 8B corresponds to the semiconductor light emitting device 191 according to the reference sample. FIG. 8A and FIG. 8B are images that forming the semiconductor layer was ended in the state in which the first well layer WL1 was formed and the sample in the state was observed using an AFM.

As revealed from FIG. 8B, in the semiconductor light emitting device 191 in which the Al containing layer AL is not provided below the well layer WL, projections and depressions on the surface are large. The surface roughness (the RMS value of root mean square roughness) of the semiconductor light emitting device 191 is about 0.46 nm. The surface roughness (the Ra value of arithmetic mean roughness) of the semiconductor light emitting device 191 is 0.37 nm.

On the contrary, as revealed from FIG. 8A, in the semiconductor light emitting device 114 in which the Al containing layer AL is provided below the well layer WL, projections and depressions on the surface are small. The surface roughness (the RMS value) of the semiconductor light emitting device 114 is about 0.42 nm. The surface roughness (the Ra value) of the semiconductor light emitting device 114 is 0.33 nm.

As described above, it was revealed that the Al containing layer AL is formed as the under layer of the well layer WL before forming the well layer WL to improve the flatness of the surface of the well layer WL.

The Al composition ratio of the Al containing layer AL was changed to similarly prepare samples, and the optical properties were evaluated according to time-resolved photoluminescence characteristics.

Figure 9A:
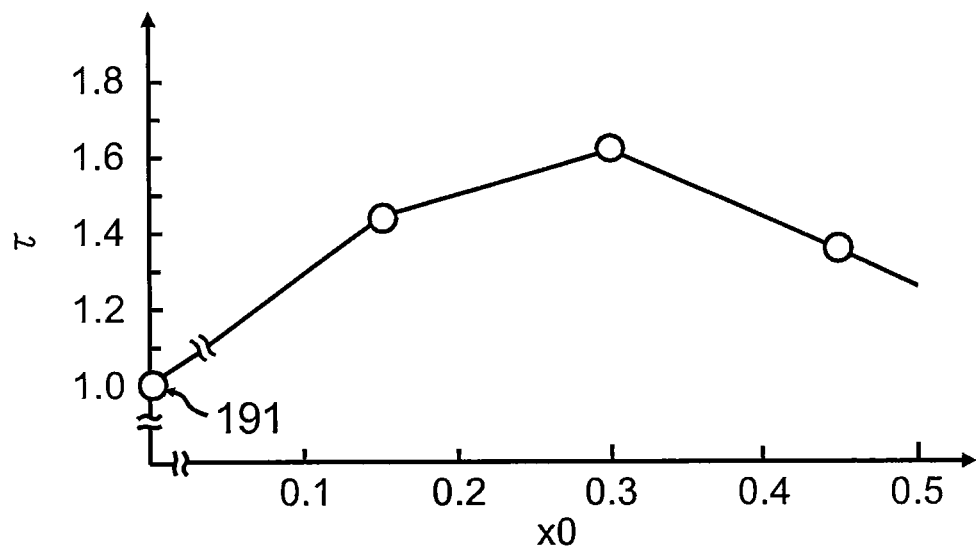
FIG. 9A and FIG. 9B are graphs illustrating characteristics of the semiconductor light emitting device.
Figure 9B:
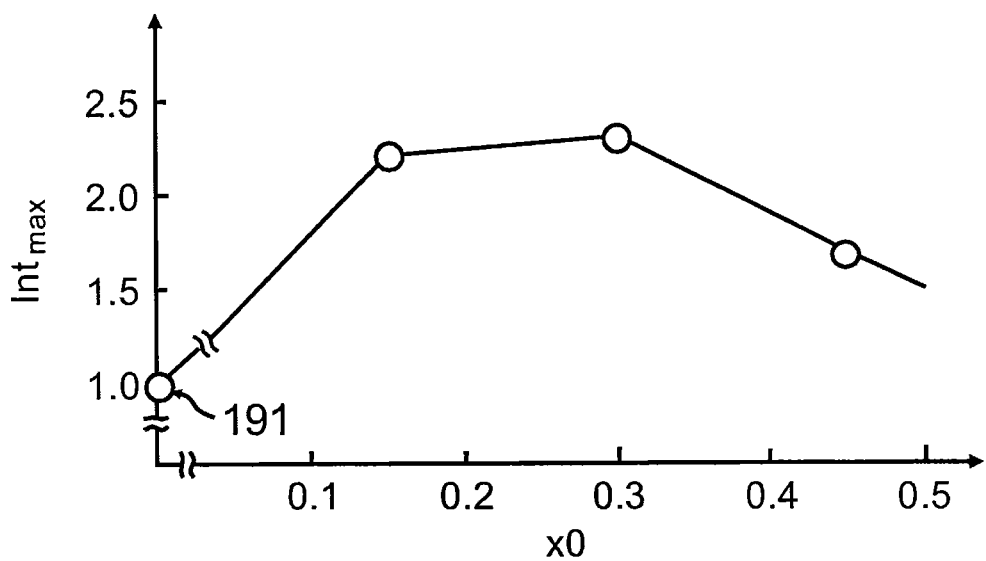

FIG. 9A and FIG. 9B are graphs illustrating the characteristics of the semiconductor light emitting device.

The horizontal axis in FIG. 9A and FIG. 9B expresses an Al composition ratio x0 of the Al containing layer AL. The characteristics of the semiconductor light emitting device 191 according to the reference sample are shown at the location where the Al composition ratio x0 is zero. The vertical axis in FIG. 9A expresses the time constant $\tau$ of the time-resolved photoluminescence characteristic. The time constant $\tau$ is normalized where the time constant of the semiconductor light emitting device 191 is one. The vertical axis in FIG. 9B expresses a maximum value $Int_{max}$ of the photoluminescence intensity Int of the time-resolved photoluminescence characteristic. The maximum value $Int_{max}$ is normalized where the maximum value of the photoluminescence intensity Int of the semiconductor light emitting device 191 is one.

As revealed from FIG. 9A, when the Al composition ratio x0 of the Al containing layer AL is 0.15, the time constant $\tau$ is 1.44. When the Al composition ratio x0 is 0.3, the time constant $\tau$ is 1.61. When the Al composition ratio x0 is 0.45, the time constant τ is 1.35. As described above, it was revealed that the time constant τ is large when the Al composition ratio x0 of the Al containing layer AL is 0.1 or more. More particularly, the time constant τ is large when the Al composition ratio x0 is 0.2 or more and 0.4 or less.

As revealed from FIG. 9B, when the Al composition ratio x0 of the Al containing layer AL is 0.15, the maximum value $Int_{max}$ of the photoluminescence intensity Int is 2.2. When the Al composition ratio x0 is 0.3, the maximum value $Int_{max}$ of the photoluminescence intensity Int is 2.3. When the Al composition ratio x0 is 0.45, the maximum value $Int_{max}$ of the photoluminescence intensity Int is 1.7. As described above, it was revealed that the maximum value $Int_{max}$ of the photoluminescence intensity Int is large when the Al composition ratio x0 of the Al containing layer AL is 0.1 or more. More particularly, the maximum value $Int_{max}$ of the photoluminescence intensity Int of is large when the Al composition ratio x0 is 0.2 or more and 0.4 or less.

There is a configuration in which an intermediate layer is provided between the well layer WL and the barrier layer BL. There is also known a configuration in which an AlGaN layer is provided as an intermediate layer between the upper and lower well layers WL. In the configurations, it is known that when the Al composition ratio of the AlGaN intermediate layer is changed in a range of 0% to 10% (0.1), light emitting efficiency is high at an Al composition ratio of 5% or less. It is known that when the Al composition ratio is 0% (namely, when the composition is GaN), light emitting efficiency is higher. Namely, it is known that light emitting efficiency is high when the Al composition ratio is low.

On the contrary, in the embodiment, an Al containing layer AL that the Al composition ratio is higher than 0.05 is disposed on the lower side of the well layer WL. More specifically, the Al composition ratio of this Al containing layer AL is 0.1 or more and desirably, 0.2 or more and 0.4 or less.

The inventors predicted before actually conducting the experiment that when the Al containing layer AL of such a high Al composition ratio is formed between the barrier layer BL and the well layer WL, a difference between the lattice constant of the Al containing layer AL and the lattice constant of the well layer WL is excessively large and then the crystal quality is degraded. However, since there were no reports on actual exemplary experiments in which the Al composition ratio is increased as described above, the inventors conducted experiments in which the Al composition ratio was changed greatly. As a result, as described above, it was revealed that the surface roughness VRMS is significantly small in the range where the Al composition ratio is 0.1 or more, more specifically, 0.2 or more and 0.4 or less that the Al composition ratio greatly exceeds 0.05. It was also revealed that the time constant τ of the time-resolved photoluminescence characteristic is significantly prolonged at the same time. Namely, it was revealed that the crystal surface becomes flat and defects in crystals are reduced at the Al composition ratio that greatly exceeds the range of 5% or less reported so far. Namely, under the conditions, crystal quality is improved, and a high light emitting efficiency can be obtained.

As described above, in the conventional configuration, such a result can be obtained that light emitting efficiency is high at an Al composition ratio of 5% or less, and more particularly, light emitting efficiency is increased at an Al composition ratio of 0%. On the contrary, in the experiment, efficiency is improved at an Al composition ratio of 0.1 or more and more particularly 0.2 or more and 0.4 or less. This is a phenomenon totally different from the conventional knowing.

As described above, when the Al containing layer AL is provided and the well layer WL is formed on the Al containing layer AL, the flatness of the surface is improved, and the crystal quality of the well layer WL is improved. Therefore, the Al containing layer AL according to the embodiment is provided to increase the In composition ratio of the well layer WL more than in the conventional configuration.

For example, in providing the first portion PL01 of a high In composition ratio, the second portion PL02 of a low In composition ratio, and the third portion PL03 of a low In composition ratio in the well layer WL, the crystal quality of the well layer WL tends to deteriorate when the concentration of the first portion PL01 of a high In composition ratio is excessively high, or when the thickness of the first portion PL01 is excessively thick. In this case, the Al containing layer AL according to the embodiment is disposed on the lower side of the well layer WL to maintain a high crystal quality even though the In composition ratio of the first portion PL01 is increased.

The thickness of the first portion PL01 of a high In composition ratio (such as the first portions PL11, PL21, PL31, and PL41, for example) is 0.5 nm or more and 2 nm or less, for example. When the thickness of the first portion PL01 exceeds 2 nm, the overlap of the wave function of the hole with the wave function of the electron is reduced and the light emitting efficiency tends to deteriorate, for example.

The thickness of the second portion PL02 and the thickness of the third portion PL03 that the In composition ratio is low are 0.5 nm or more and 2 nm or less, for example.

The thickness of the well layer WL (the entire thickness of a single well layer WL) is 1 nm or more and 10 nm or less, for example. In the case where the thickness of the well layer WL is less than 1 nm, the confinement effect of carriers of the well layer WL becomes small to reduce light emitting efficiency. When the thickness of the well layer WL exceeds 10 nm, crystal quality significantly deteriorates. The thickness of the well layer WL is 3 nm, for example.

In the embodiment, the thickness of the Al containing layer AL is 0.5 nm or more and 2.5 nm or less, for example. More specifically, the thickness of the Al containing layer AL is about 1.0 nm, for example. Alternatively, the thickness of the Al containing layer AL is about 1.5 nm, for example. The operating voltage when the thickness of the Al containing layer AL is 1.0 nm is lower than the operating voltage when the thickness of the Al containing layer AL is 1.5 nm. The wall plug efficiency when the thickness of the Al containing layer AL is 1.0 nm is higher than the wall plug efficiency when the thickness of the Al containing layer AL is 1.5 nm.

In the embodiment, the thickness of the barrier layer BL is 5 nm or more and 30 nm or less, for example. For example, when the thickness of the Al containing layer AL is 1.5 nm, the thickness of the barrier layer BL is 10 nm, for example.

Second Embodiment

Figure 10:
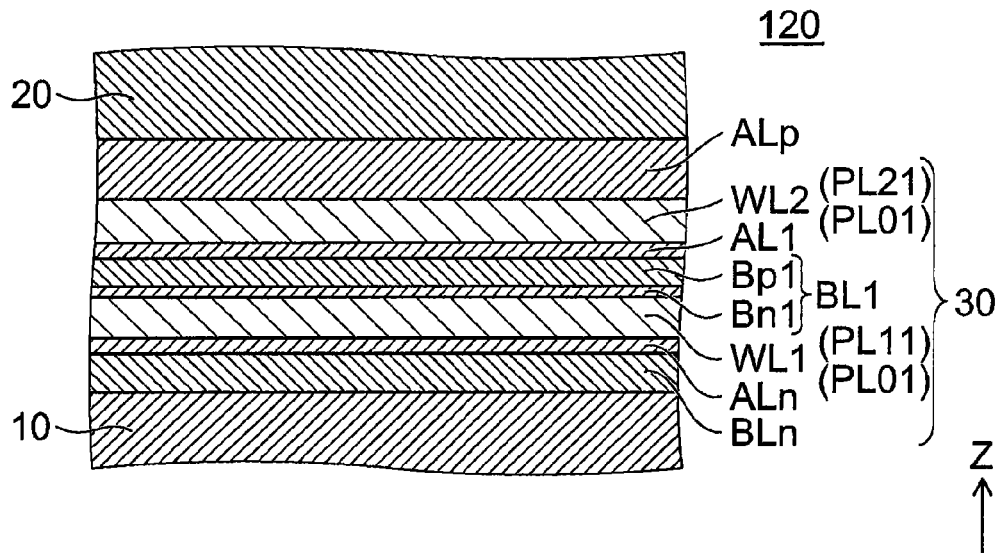
FIG. 10 is a schematic cross-sectional view illustrating a configuration of a semiconductor light emitting device according to a second embodiment.

FIG. 10 is a schematic cross-sectional view illustrating the configuration of a semiconductor light emitting device according to a second embodiment.

As shown in FIG. 10, a semiconductor light emitting device 120 according to the embodiment also includes a first semiconductor layer 10, a second semiconductor layer 20, and a light emitting layer 30. Also in the embodiment, the light emitting layer 30 includes a plurality of well layers WL (including a first well layer WL1 and a second well layer WL2, for example), a barrier layer BL, and an Al containing layer AL.

The well layer WL has a portion (a first portion PL01) containing $In_{p01}Ga_{1-p01}N$ (0.1<p 01≤0.4). For example, the first well layer WL1 has a portion (a first portion PL11)

containing $In_{p11}Ga_{1-p11}N$ (0.1<p 11≤0.4). For example, the second well layer WL2 has a portion (a first portion PL21) containing $In_{p21}Ga_{1-p21}N$ (0.1<p 21≤0.4).

In the embodiment, the barrier layer BL includes a plurality of portions (a plurality of layers) having Al composition ratios different from each other.

Namely, a first barrier layer BL1 includes a first n-side layer Bn1 and a first p-side layer Bp1. The first n-side layer Bn1 contacts the first well layer WL1. The band gap energy of the first n-side layer Bn1 is greater than the band gap energy of the first portion PL01 (the first portion PL11). The first n-side layer Bn1 contains $Al_{q11}In_{r11}Ga_{1-q11-r11}N$ (0≤q11<1, 0≤r11<1, 0≤q11+r11≤1, and r11<p21).

The first p-side layer Bp1 is provided between the first n-side layer Bn1 and the second semiconductor layer 20 (between the first n-side layer Bn1 and a first Al containing layer AL1). The band gap energy of the first p-side layer Bp1 is greater than the band gap energy of the first portion PL01 (the first portion PL11). The first p-side layer Bp1 contains $Al_{q12}In_{r12}Ga_{1-q12-r12}N$ (0≤q12<1, 0≤r12<1, 0≤q12+r12≤1, q12<q11, and r12<p21).

The configurations other than the configuration are equivalent to the configurations of the semiconductor light emitting device 110, and the description is omitted.

In the first barrier layer BL1, the first p-side layer Bp1 is disposed on the first n-side layer Bn1. The band gap energy of the first p-side layer Bp1 is smaller than the band gap energy of the first n-side layer Bn1.

The In composition ratios of the first n-side layer Bn1 and the first p-side layer Bp1 are zero, for example. The Al composition ratio of the first n-side layer Bn1 is 0.1 or more and 0.3 or less, for example. $Al_{0.15}Ga_{0.85}N$ is used for the first n-side layer Bn1, for example. Alternatively, $A_{0.3}Ga_{0.7}N$ is used for the first n-side layer Bn1, for example. The Al composition ratio of the first p-side layer Bp1 is less than 0.1, for example. GaN is used for the first p-side layer Bp1, for example.

The thickness of the first n-side layer Bn1 is 0.1 nm or more and 5 nm or less, for example. In the case where the thickness of the first n-side layer Bn1 is less than 0.1 nm, the confinement effect of carriers to the well layer WL is reduced, and it is difficult to obtain a high light emitting efficiency. When the thickness of the first n-side layer Bn1 exceeds 5 nm, the operating voltage is significantly increased. The thickness of the first n-side layer Bn1 is 1 nm, for example.

The thickness of the first p-side layer Bp1 is 1 nm or more and 30 nm or less, for example. In the case where the thickness of the first p-side layer Bp1 is less than 1 nm, crystal quality deteriorates and it is difficult to obtain a high light emitting efficiency. When the thickness of the first p-side layer Bp1 exceeds 30 nm, the operating voltage is increased. The thickness of the first p-side layer Bp1 is 10 nm, for example.

As described above, in the embodiment, the band gap energy distribution is formed in a single barrier layer BL. Namely, in the barrier layer BL provided on the well layer WL, the band gap energy of the portion (the first n-side layer Bn1) contacting the well layer WL is increased more than the band gap energy of the portion (the first p-side layer Bp1) other than the former portion.

Thereby, the light emitting efficiency is improved, for example. More particularly, a high light emitting efficiency can be particularly obtained in a semiconductor light emitting device having the peak wavelength λp of the light emitted from the light emitting layer 30 longer than 515 nm.

In accordance with the configuration according to the embodiment, it is considered that the reason why the high efficiency described above can be obtained is that a reduction in light emitting efficiency due to the quantum confinement Stark effect is suppressed.

In the semiconductor light emitting device, the well layer WL is strained to generate a piezoelectric field. The piezoelectric field sometimes reduces the integral value of the overlap of the wave function of the hole with the wave function of the electron to decrease light emitting efficiency. For example, in the case where the piezoelectric field is inappropriately controlled, the wave function of the electron of the well layer WL leaks to the second semiconductor layer 20 side, for example. More particularly, in the well layer WL at a long wavelength, strain is increased, and this tendency is noticeable.

When strain is increased, an AlGaN layer (the first n-side layer Bn1, for example) is provided on the portion of the barrier layer BL on the second semiconductor layer 20 side contacting the well layer WL to suppress the leakage of electrons to the second semiconductor layer 20 side. Since electrons have a small effective mass, the AlGaN layer is provided to shift the wave function of the electron to the first semiconductor layer 10 side more than the wave function of the hole is. Thereby, it is possible to increase the integral value of the overlap of the wave function of the hole with the wave function of the electron.

Figure 11:
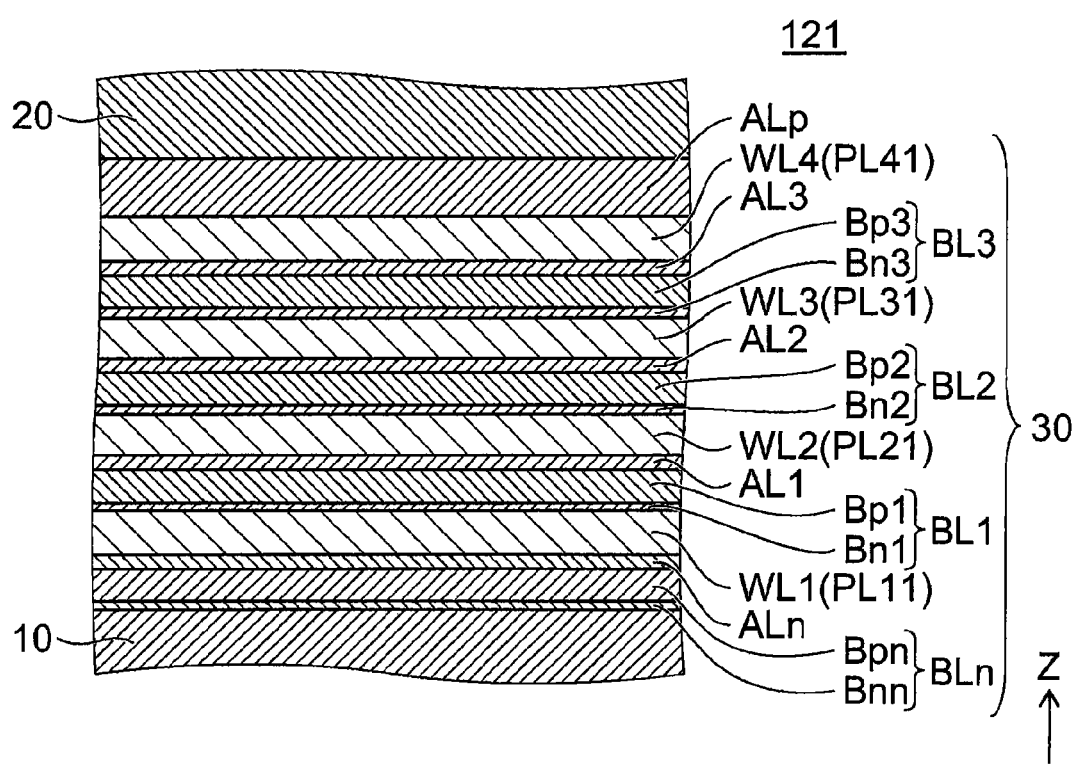
FIG. 11 is a schematic cross-sectional view illustrating a configuration of another semiconductor light emitting device according to the second embodiment.

FIG. 11 is a schematic cross-sectional view illustrating the configuration of another semiconductor light emitting device according to the second embodiment.

As shown in FIG. 11, also in another semiconductor light emitting device 121 according to the embodiment, a plurality of portions (a plurality of layers) having Al composition ratios different from each other are provided on individual barrier layers BL. The configurations other than the configuration are the same in the semiconductor light emitting device 111, and the description is omitted.

A first barrier layer BL1 includes the first n-side layer Bn1 and the first p-side layer Bp1.

For example, a light emitting layer 30 further includes a second barrier layer BL2 provided between a second well layer WL2 and a second semiconductor layer 20. The second barrier layer BL2 includes a second n-side layer Bn2 and a second p-side layer Bp2. The second n-side layer Bn2 contacts the second well layer WL2, and the band gap energy is greater than the band gap energy of the first portion PL21 of the second well layer WL2. The second barrier layer BL2 contains $Al_{q21}In_{r21}Ga_{1-q21-r21}N$ (0≤q21<1, 0≤r21<1, 0≤q21+r21≤1, and r21<p21). The second p-side layer Bp2 is provided between the second n-side layer Bn2 and the second semiconductor layer 20, and the band gap energy is greater than the band gap energy of the first portion PL21. The second p-side layer Bp2 contains $Al_{q22}In_{r22}Ga_{1-q22-r22}N$ (0≤q22<1, 0≤r22<1, 0≤q22+r22≤1, q22<q21, and r22<p21). Namely, the second barrier layer BL2 includes a portion of a high Al composition ratio (the second n-side layer Bn2) on the first semiconductor layer 10 side and a portion of a relatively low Al composition ratio (the second p-side layer Bp2) on the second semiconductor layer 20 side.

Similarly, a third barrier layer BL3 includes a portion of a high Al composition ratio (a third n-side layer Bn3) on the first semiconductor layer 10 side and a portion of a relatively low Al composition ratio (a third p-side layer Bp3) on the second semiconductor layer 20 side. An n-side barrier layer BLn includes a portion of a high Al composition ratio (a n-side layer Bnn) on the first semiconductor layer 10 side and a portion of a relatively low Al composition ratio (a p-side layer Bpp) on the second semiconductor layer 20 side.

Also in the semiconductor light emitting device 121, a reduction in light emitting efficiency is suppressed, and a high efficiency can be obtained.

Figure 12:
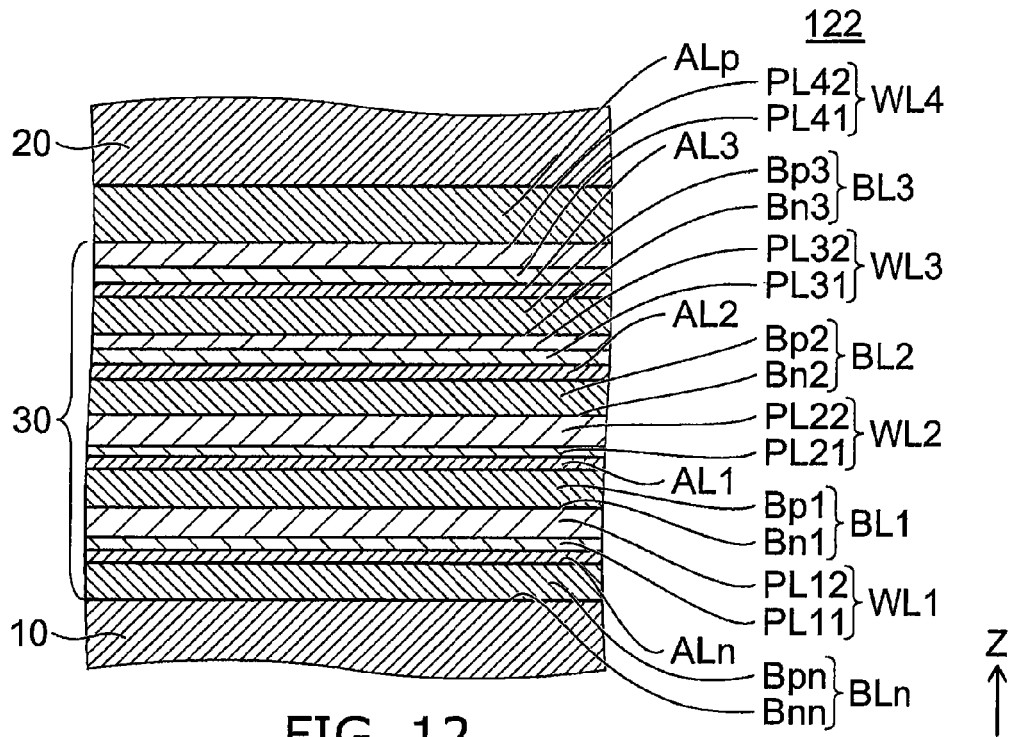
FIG. 12 is a schematic cross-sectional view illustrating a configuration of still another semiconductor light emitting device according to the second embodiment.

FIG. 12 is a schematic cross-sectional view illustrating the configuration of still another semiconductor light emitting device according to the second embodiment.

As shown in FIG. 12, also in still another semiconductor light emitting device 122 according to the embodiment, a plurality of portions (a plurality of layers) having Al composition ratios different from each other are provided on individual barrier layers BL. The configurations other than the configuration are the same in the semiconductor light emitting device 112, and the description is omitted.

Figure 13:
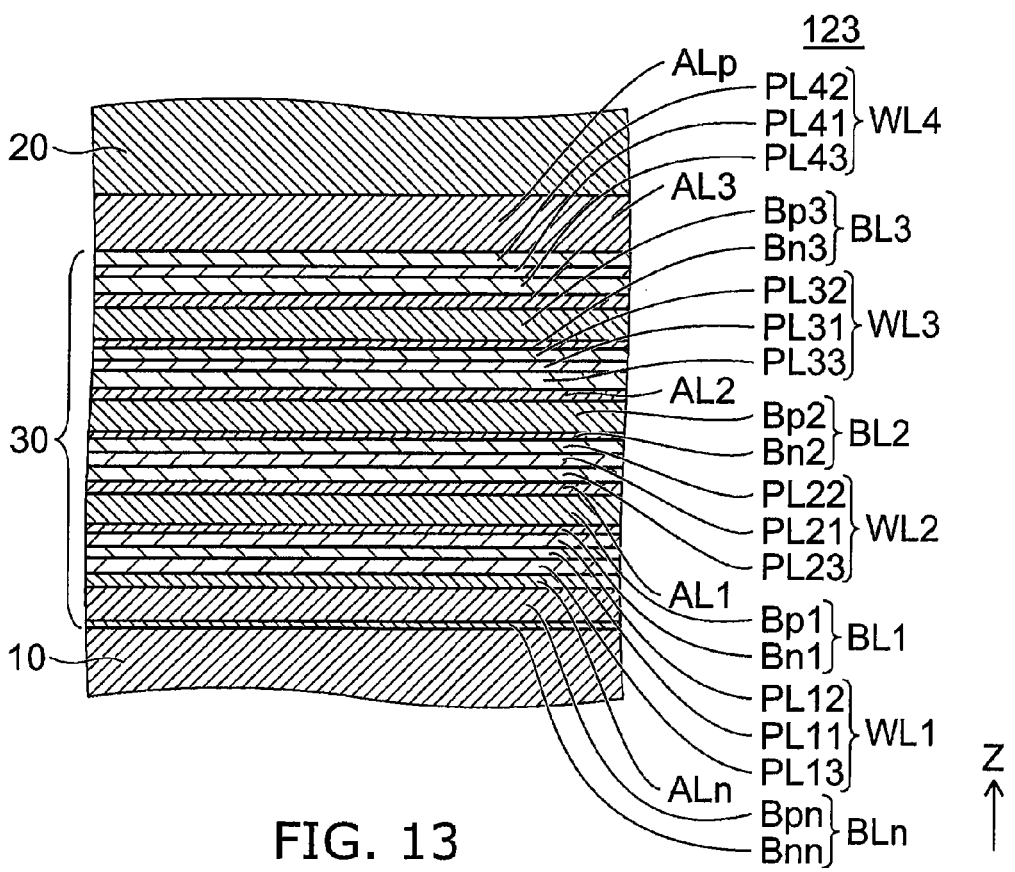
FIG. 13 is a schematic cross-sectional view illustrating a configuration of yet another semiconductor light emitting device according to the second embodiment.

FIG. 13 is a schematic cross-sectional view illustrating the configuration of yet another semiconductor light emitting device according to the second embodiment.

As shown in FIG. 13, also in yet another semiconductor light emitting device 123 according to the embodiment, a plurality of portions (a plurality of layers) having Al composition ratios different from each other are provided on individual barrier layers BL. The configurations other than the configuration are the same in the semiconductor light emitting device 113, and the description is omitted.

Also in the semiconductor light emitting device 123, a stacked body 40 may be further provided as similar to the semiconductor light emitting device 114.

Also in the semiconductor light emitting devices 122 and 123, a reduction in light emitting efficiency is suppressed, and a high efficiency can be obtained.

According to the embodiment, it is possible to provide a highly efficient semiconductor light emitting device of a high crystal quality.

In the specification, "the nitride semiconductor" includes all semiconductors having compositions where composition ratios x, y, and z are changed in the individual ranges in a chemical formula $B_xIn_yAl_zGa_{1-x-y-z}N$ ($0 \leq x \leq 1$, $0 \leq y \leq 1$, $0 \leq z \leq 1$, and $x+y+z \leq 1$). Moreover, "the nitride semiconductor" also includes semiconductors further containing V group elements other than N (nitrogen) in the chemical formula, semiconductors further containing various elements added for controlling various physical properties such as a conductive type, and semiconductors further containing various elements unintentionally included.

As described above, the embodiments of the invention are described with reference to specific examples. However, the embodiments of the invention are not limited to these specific examples. For example, the specific configurations of the components such as the first semiconductor layer, the second semiconductor layer, the light emitting layer, the well layer, the barrier layer, and the Al containing layer included in the semiconductor light emitting device are incorporated in the scope of the invention as long as a person skilled in the art appropriately selects components from the publicly known range to similarly implement the invention for obtaining the similar effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first semiconductor layer including a nitride semiconductor, the first semiconductor layer being of an n-type;
   a second semiconductor layer including a nitride semiconductor, the second semiconductor layer being of a p-type; and
   a light emitting layer provided between the first semiconductor layer and the second semiconductor layer, the light emitting layer including:
   a first well layer including a nitride semiconductor;
   a second well layer provided between the first well layer and the second semiconductor layer and including a nitride semiconductor;
   a first barrier layer provided between the first well layer and the second well layer and including a nitride semiconductor, the first barrier layer directly contacting the first well layer, a band gap energy of the first barrier layer being greater than a band gap energy of the first well layer and a band gap energy of the second well layer; and
   a first Al containing layer provided between the first barrier layer and the second well layer, the first Al containing layer directly contacting the first barrier layer and the second well layer, and the first Al containing layer containing $Al_{x1}Ga_{1-x1}N$ ($0.1 \leq x1 \leq 0.35$),
   wherein the first barrier layer includes a first n-side layer and a first p-side layer provided between the first n-side layer and the first Al containing layer, and
   an Al composition ratio of the first p-side layer is less than an Al composition ratio of the first Al containing layer.

2. The device according to claim 1, wherein a thickness of the first Al containing layer is 0.5 nanometer or more and 2.5 nanometers or less.

3. The device according to claim 1, wherein the second well layer includes a first portion containing $In_{p21}Ga_{1-p21}N$ ($0.1 < p21 \leq 0.4$).

4. The device according to claim 3, wherein the second well layer further includes a second portion provided between the first portion and the second semiconductor layer and containing $In_{p22}Ga_{1-p22}N$ ($0 < p22 < p21$).

5. The device according to claim 4, wherein the second well layer further includes a third portion provided between the first portion and the first Al containing layer and containing $In_{p23}Ga_{1-p23}N$ ($0 < p23 < p21$).

6. The device according to claim 3, wherein a thickness of the first portion is 0.5 nanometer or more and 2 nanometers or less.

7. The device according to claim 3, wherein the first barrier layer includes
   the first n-side layer contacting the first well layer and containing $Al_{q11}In_{r11}Ga_{1-q11-r11}N$ ($0 \leq q11 < 1$, $0 \leq r11 < 1$, $0 \leq q11+r11 \leq 1$, and $r11 < p21$), a band gap energy of the first n-side layer being greater than the band gap energy of the first portion, and
   the first p-side layer provided between the first n-side layer and the second semiconductor layer and containing $Al_{q12}In_{r12}Ga_{1-q12-r12}N$ ($0 \leq q12 < 1$, $0 \leq r12 < 1$, $0 \leq q12+r12 \leq 1$, $q12 < q11$, and $r12 < p21$), a band gap energy of the first p-side layer being greater than the band gap energy of the first portion.

8. The device according to claim 7, wherein
   a thickness of the first n-side layer is 0.5 nanometer or more and 5 nanometers or less, and
   a thickness of the first p-side layer is 0.5 nanometer or more and 30 nanometers or less.

9. The device according to claim 3, wherein the light emitting layer further includes a second barrier layer provided between the second well layer and the second semiconductor layer, and the second barrier layer includes a second n-side layer contacting the second well layer and containing $Al_{q21}In_{r21}Ga_{1-q21-r21}N$ ($0 \leq q21 < 1$, $0 \leq r21 < 1$, $0 \leq q21+r21 \leq 1$, and $r21 < p21$), a band gap energy of the second n-side layer being greater than the band gap energy of the first portion, and a second p-side layer provided between the second n-side layer and the second semiconductor layer and containing $Al_{q22}In_{r22}Ga_{1-q22-r22}N$ ($0 \leq q22 < 1$, $0 \leq r22 < 1$, $0 \leq q22+r22 \leq 1$, $q22 < q21$, and $r22 < p21$), a band gap energy of the second p-side layer being greater than the band gap energy of the first portion.

10. The device according to claim 9, wherein a thickness of the second n-side layer is 0.5 nanometer or more and 5 nanometers or less, and a thickness of the second p-side layer is 0.5 nanometer or more and 30 nanometers or less.

11. The device according to claim 1, wherein the second semiconductor layer is disposed on a [0001] direction side of the first semiconductor layer.

12. The device according to claim 1, wherein a major surface of the first semiconductor layer is a c-plane.

13. The device according to claim 3, wherein the light emitting layer further includes a third well layer provided between the second well layer and the second semiconductor layer and including a nitride semiconductor, a second barrier layer provided between the second well layer and the third well layer and including a nitride semiconductor, a band gap energy of the second barrier layer being greater than a band gap energy of the second well layer and a band gap energy of the third well layer, and a second Al containing layer contacting the third well layer between the second barrier layer and the third well layer and containing $Al_{x2}Ga_{1-x2}N$ ($0.1 \leq x2 \leq 0.35$).

14. The device according to claim 13, wherein a thickness of the second Al containing layer is 0.5 nanometer or more and 2.5 nanometers or less.

15. The device according to claim 13, wherein the third well layer includes a first portion of the third well layer containing $In_{p31}Ga_{1-p31}N$ ($0.1 < p31 \leq 0.4$).

16. The device according to claim 15, wherein the third well layer further includes a second portion of a third well layer provided between the first portion of the third well layer and the second semiconductor layer and containing $In_{p32}Ga_{1-p32}N$ ($0 < p32 < p31$), and a third portion of the third well layer provided between the first portion of the third well layer and the first semiconductor layer and containing $In_{p33}Ga_{1-p33}N$ ($0 < p33 < p31$).

17. The device according to claim 15, wherein a thickness of the first portion of the third well layer is 1 nanometer or more and 2 nanometers or less.

18. The device according to claim 1, wherein the light emitting layer further includes an n-side barrier layer provided between the first well layer and the first semiconductor layer and including a nitride semiconductor, a band gap energy of the n-side barrier layer being greater than a band gap energy of the first well layer and a band gap energy of the second well layer, and an n-side Al containing layer contacting the first well layer between the n-side barrier layer and the first well layer and containing $Al_{xn}Ga_{1-xn}N$ ($0.1 \leq xn \leq 0.35$).

19. The device according to claim 1, further comprising a p-side Al containing layer provided between the light emitting layer and the second semiconductor layer and including a nitride semiconductor containing Al, a band gap energy of the p-side Al containing layer being greater than a band gap energy of the first barrier layer.

20. The device according to claim 1, wherein a peak wavelength of light emitted from the light emitting layer is 450 nanometers or more and 670 nanometers or less.

21. The device according to claim 1, wherein a thickness of the first barrier layer is 5 nanometer or more and 30 nanometers or less.

22. The device according to claim 11, wherein a thickness of the first Al containing layer is 0.5 nanometer or more and 2.5 nanometers or less.

23. The device according to claim 22, wherein the second well layer includes a first portion containing $In_{p21}Ga_{1-p21}N$ ($0.1 < p21 \leq 0.4$).

24. The device according to claim 23, wherein a peak wavelength of light emitted from the light emitting layer is 450 nanometers or more and 670 nanometers or less.

25. The device according to claim 24, wherein a thickness of the first barrier layer is 5 nanometer or more and 30 nanometers or less.

26. The device according to claim 1, wherein a peak wavelength of light emitted from the light emitting layer is 400 nanometers or more and 670 nanometers or less.

* * * * *